(12) United States Patent
Zenou et al.

(10) Patent No.: US 12,046,575 B2
(45) Date of Patent: Jul. 23, 2024

(54) METHOD TO ELECTRICALLY CONNECT CHIP WITH TOP CONNECTORS USING 3D PRINTING

(71) Applicant: IO Tech Group Ltd., London (GB)

(72) Inventors: Michael Zenou, Hashmonaim (IL); Ziv Gilan, Kfar-harif (IL); Guy Nesher, Nes Ziona (IL)

(73) Assignee: IO Tech Group Ltd., Modiin (IL)

( * ) Notice: Subject to any disclaimer, the term of this patent is extended or adjusted under 35 U.S.C. 154(b) by 272 days.

(21) Appl. No.: 15/929,281

(22) Filed: Apr. 22, 2020

(65) Prior Publication Data

US 2020/0350275 A1 Nov. 5, 2020

Related U.S. Application Data

(60) Provisional application No. 62/841,349, filed on May 1, 2019.

(51) Int. Cl.
  *H05K 3/00* (2006.01)
  *H01L 23/00* (2006.01)
  (Continued)

(52) U.S. Cl.
  CPC ........... *H01L 24/82* (2013.01); *H05K 3/1283* (2013.01); *H05K 3/32* (2013.01);
  (Continued)

(58) Field of Classification Search
  CPC ............ H05K 3/00; H01L 24/00; C23C 14/00
  See application file for complete search history.

(56) References Cited

U.S. PATENT DOCUMENTS

| 5,155,324 A | 10/1992 | Deckard et al. |
| 5,174,843 A | 12/1992 | Natter |

(Continued)

FOREIGN PATENT DOCUMENTS

| CN | 1979816 A | 6/2007 | |
| CN | 103597589 A * | 2/2014 | ............. B29C 65/16 |

(Continued)

OTHER PUBLICATIONS

DE102011083627A1_English_translate (Year: 2011).*

(Continued)

*Primary Examiner* — Kelly M Gambetta
*Assistant Examiner* — Mohammad Mayy
(74) *Attorney, Agent, or Firm* — Ascenda Law Group, PC

(57) ABSTRACT

A method for fabricating a three-dimensional (3D) electronic device. A liquid support material (e.g., an epoxy acrylate with a photoinitiator) is applied by a laser-induced forward transfer (LIFT) process to a printed circuit board (PCB) having one or more connectors and one or more electronic components thereon, and then cured to solid form by cooling and/or exposure to ultraviolet (UV) radiation. A layer of conductive material (e.g., a metal) is printed on the solidified support material by LIFT to electrically connect the one or more electronic components to respective ones of the connectors on the PCB. Subsequently, the layer of conductive material is dried by heating and metal particles in the conductive layer sintered using a laser beam. The assembly may then be encapsulated in an encapsulant.

11 Claims, 11 Drawing Sheets

(51) Int. Cl.
*H05K 3/12* (2006.01)
*H05K 3/32* (2006.01)

(52) U.S. Cl.
CPC .............. *H01L 2224/82051* (2013.01); *H01L 2224/82103* (2013.01); *H01L 2224/8284* (2013.01)

(56) References Cited

U.S. PATENT DOCUMENTS

| | | | |
|---|---|---|---|
| 5,192,559 A | 3/1993 | Hull et al. | |
| 5,200,285 A | 4/1993 | Carrish | |
| 5,204,055 A | 4/1993 | Sachs et al. | |
| 5,236,637 A | 8/1993 | Hull | |
| 5,352,310 A | 10/1994 | Natter | |
| 5,436,083 A | 7/1995 | Haluska et al. | |
| 5,506,607 A | 4/1996 | Sanders, Jr. et al. | |
| 5,593,531 A | 1/1997 | Penn | |
| 5,637,175 A | 6/1997 | Feygin et al. | |
| 5,740,051 A | 4/1998 | Sanders, Jr. et al. | |
| 5,837,960 A | 11/1998 | Lewis et al. | |
| 6,056,843 A | 5/2000 | Morita et al. | |
| 6,122,036 A | 9/2000 | Yamasaki et al. | |
| 6,206,672 B1 | 3/2001 | Grenda | |
| 6,537,359 B1 | 3/2003 | Spa | |
| 7,198,736 B2 | 4/2007 | Kasuga et al. | |
| 7,438,846 B2 | 10/2008 | John | |
| 7,658,603 B2 | 2/2010 | Medina et al. | |
| 7,731,887 B2 | 6/2010 | Hull et al. | |
| 7,771,183 B2 | 8/2010 | Hull et al. | |
| 7,892,474 B2 | 2/2011 | Shkolnik et al. | |
| 8,236,373 B2 | 8/2012 | Fumo et al. | |
| 8,252,223 B2 | 8/2012 | Medina et al. | |
| 8,488,994 B2 | 7/2013 | Hanson et al. | |
| 8,740,040 B2 | 6/2014 | Choi et al. | |
| 8,879,957 B2 | 11/2014 | Hanson et al. | |
| 9,636,873 B2 | 5/2017 | Joyce | |
| 9,744,730 B2 | 8/2017 | Comb | |
| 9,808,822 B2 | 11/2017 | Martensson et al. | |
| 9,901,983 B2 | 2/2018 | Hovel et al. | |
| 9,919,479 B2 | 3/2018 | Baecker et al. | |
| 9,925,797 B2 | 3/2018 | Kotler et al. | |
| 10,011,071 B2 | 7/2018 | Batchelder | |
| 10,137,634 B2 | 11/2018 | Ruiz et al. | |
| 10,144,034 B2 | 12/2018 | Zenou | |
| 10,144,175 B2 | 12/2018 | Batchelder | |
| 10,180,649 B2 | 1/2019 | Nowak et al. | |
| 10,369,744 B2 | 8/2019 | Winters et al. | |
| 10,723,072 B1 | 7/2020 | Zeman et al. | |
| 2002/0139264 A1 | 10/2002 | Bartscher et al. | |
| 2003/0107127 A1 | 6/2003 | Murai | |
| 2004/0101619 A1 | 5/2004 | Camorani | |
| 2005/0109734 A1 | 5/2005 | Kuriyama et al. | |
| 2005/0212888 A1 | 9/2005 | Lehmann et al. | |
| 2006/0145746 A1* | 7/2006 | Metzler | G05F 1/565 327/427 |
| 2007/0128760 A1* | 6/2007 | Subramanian | H01L 29/86 257/E29.325 |
| 2007/0164089 A1 | 7/2007 | Gaugler | |
| 2007/0201122 A1* | 8/2007 | Dozeman | B60R 1/088 359/265 |
| 2008/0044684 A1 | 2/2008 | Chan et al. | |
| 2008/0166490 A1 | 7/2008 | Hogan et al. | |
| 2009/0074987 A1 | 3/2009 | Auyeung et al. | |
| 2009/0217517 A1 | 9/2009 | Pique et al. | |
| 2009/0274833 A1* | 11/2009 | Li | C09D 11/52 106/31.92 |
| 2011/0017841 A1 | 1/2011 | Holm et al. | |
| 2012/0007254 A1 | 1/2012 | Yang | |
| 2013/0078013 A1 | 3/2013 | Chillscyzn et al. | |
| 2013/0176700 A1 | 7/2013 | Stevens et al. | |
| 2013/0186558 A1 | 7/2013 | Comb et al. | |
| 2013/0224474 A1 | 8/2013 | Theunissen et al. | |
| 2014/0374958 A1 | 12/2014 | Taniuchi et al. | |
| 2015/0021628 A1* | 1/2015 | Medendorp, Jr. | H01L 33/56 257/99 |
| 2015/0033557 A1 | 2/2015 | Kotler et al. | |
| 2015/0239236 A1 | 8/2015 | Stefani et al. | |
| 2016/0193688 A1 | 7/2016 | Kironn et al. | |
| 2016/0233089 A1* | 8/2016 | Zenou | H01L 21/268 |
| 2017/0120260 A1 | 5/2017 | Oetjen | |
| 2017/0189995 A1 | 7/2017 | Zenou et al. | |
| 2017/0210142 A1 | 7/2017 | Kotler et al. | |
| 2017/0244013 A1* | 8/2017 | Curtis | G02B 27/017 |
| 2017/0250294 A1 | 8/2017 | Zenou et al. | |
| 2017/0260359 A1 | 9/2017 | Hanyu et al. | |
| 2017/0297111 A1 | 10/2017 | Myerberg et al. | |
| 2017/0306495 A1 | 10/2017 | Kotler et al. | |
| 2017/0348908 A1 | 12/2017 | Liu et al. | |
| 2018/0015502 A1 | 1/2018 | Zenou | |
| 2018/0090314 A1* | 3/2018 | Kotler | B41J 2/005 |
| 2018/0193948 A1 | 7/2018 | Zenou et al. | |
| 2018/0281243 A1 | 10/2018 | Zenou et al. | |
| 2019/0143449 A1 | 5/2019 | Zenou | |
| 2019/0150292 A1 | 5/2019 | Tsukada et al. | |
| 2019/0322036 A1 | 10/2019 | Zenou et al. | |
| 2021/0028141 A1 | 1/2021 | Zenou et al. | |
| 2021/0237184 A1 | 8/2021 | Zenou et al. | |
| 2021/0267067 A1 | 8/2021 | Ziv et al. | |
| 2021/0385951 A1 | 12/2021 | Zenou | |
| 2022/0040912 A1 | 2/2022 | Zenou et al. | |

FOREIGN PATENT DOCUMENTS

| | | | |
|---|---|---|---|
| CN | 104797087 A | 7/2015 | |
| CN | 106575077 A | 4/2017 | |
| CN | 109153037 A | 1/2019 | |
| CN | 109315066 A | 2/2019 | |
| CN | 109564792 A | 4/2019 | |
| DE | 102011083627 A1 | 3/2013 | |
| DE | 102017120750 A1 | 3/2019 | |
| EP | 1213083 A2 | 6/2002 | |
| EP | 3032933 A1 | 6/2016 | |
| EP | 3089573 A1 | 11/2016 | |
| EP | 3219412 A1 | 9/2017 | |
| EP | 3468312 A1 | 4/2019 | |
| JP | H01 221466 A | 9/1989 | |
| WO | 01/72489 A2 | 10/2001 | |
| WO | 2007020644 A1 | 2/2007 | |
| WO | 2007026366 A1 | 3/2007 | |
| WO | 2007/084888 A2 | 7/2007 | |
| WO | 2014/078537 A1 | 5/2014 | |
| WO | 2014/113937 A1 | 7/2014 | |
| WO | 2014/126837 A2 | 8/2014 | |
| WO | 2015/144967 A2 | 10/2015 | |
| WO | 2015/192146 A1 | 12/2015 | |
| WO | 2016/020817 A1 | 2/2016 | |
| WO | 2016/124708 A1 | 8/2016 | |
| WO | 2016/198291 A1 | 12/2016 | |
| WO | 2018003000 A1 | 1/2018 | |
| WO | WO-2018104432 A1 * | 6/2018 | C08K 3/08 |
| WO | 2018136480 A1 | 7/2018 | |
| WO | 2018216002 A1 | 11/2018 | |

OTHER PUBLICATIONS

CN-103597589-A, English Translated (Year: 2014).*
International Preliminary Report on Patentability dated Jul. 27, 2021, from the IPEA/European Patent Office, for International Patent Application No. PCT/IB2020/053827 (filed Apr. 22, 2020), 37 pgs.
International Search Report and Written Opinion mailed Apr. 16, 2021, from the ISA/European Patent Office, for International Patent Application No. PCT/IB2021/050025 (filed Jan. 5, 2021), 13 pgs.
International Search Report and Written Opinion mailed Apr. 1, 2021, from the ISA/European Patent Office, for International Patent Application No. PCT/IB2021/050026 (filed Jan. 5, 2021), 13 pgs.
Non-Final Office Action dated Jan. 28, 2022, for U.S. Appl. No. 17/302,449, filed May 3, 2021, 10 pgs.
International Preliminary Report on Patentability mailed Jan. 14, 2022, from the IPEA/European Patent Office, for International

(56) References Cited

OTHER PUBLICATIONS

Patent Application No. PCT/IB2021/050025 (filed May 1, 2021), 19 pgs.
Written Opinion of the International Preliminary Examining Authority mailed Jan. 5, 2022, from the IPEA/European Patent Office, for International Patent Application No. PCT/IB2021/050026 (filed May 1, 2021), 8 pgs.
International Search Report and Written Opinion mailed Apr. 29, 2021, from ISA/European Patent Office, for International Patent Application No. PCT/IB2021/050027 (filed Jan. 5, 2021), 11 pgs.
Non-Final Office Action dated Feb. 15, 2022, for U.S. Appl. No. 16/807,489, filed Mar. 3, 2020, 19 pgs.
Amendment filed Mar. 28, 2022, for U.S. Appl. No. 16/807,489, filed Mar. 3, 2020, 17 pgs.
Amendment filed Apr. 4, 2022, for U.S. Appl. No. 17/302,449, filed May 3, 2021, 10 pgs.
Written Opinion of the International Preliminary Examining Authority mailed Mar. 19, 2021, from the IPEA/European Patent Office, for International Patent Application No. PCT/IB2020/053827 (filed Apr. 22, 2020), 6 pgs.
International Search Report and Written Opinion mailed Jun. 24, 2020, from the ISA/European Patent Office, for International Patent Application No. PCT/IB2020/053827 (filed Apr. 22, 2020), 15 pages.
Amendment filed Jul. 5, 2022, for U.S. Appl. No. 17/247,981, filed Jan. 4, 2021, 8 pgs.
International Preliminary Report on Patentability mailed Jul. 5, 2022, from the IPEA/European Patent Office, for International Patent Application No. PCT/IB021/050027 (filed Jan. 5, 2021), 6 pgs.
International Preliminary Report on Patentability dated Jun. 15, 2022, from the IPEA/European Patent Office, for International Patent Application No. PCT/IB/2021/050026 (filed Jan. 5, 2021), 6 pgs.
Notice of Allowance mailed Jun. 16, 2022, for U.S. Appl. No. 16/807,489, filed Mar. 3, 2020, 9 pgs.
Final Office Action dated Jun. 9, 2022, for U.S. Appl. No. 17/302,449, filed May 3, 2021, 11 pgs.
Non-Final Office Action mailed Jun. 23, 2022 for U.S. Appl. No. 17/247,781, filed Jan. 4, 2021, 14 pgs.
Amendment filed Jul. 22, 2022, for U.S. Appl. No. 17/302,449, filed May 3, 2021, 7 pgs.
Advisory Action dated Aug. 10, 2022, for U.S. Appl. No. 17/302,449, filed May 3, 2021, 3 pgs.
Notice of Allowance mailed Sep. 8, 2022, for U.S. Appl. No. 17/302,449, filed May 3, 2021, 9 pgs.
Chinese Patent Publication No. 103597589 A, published Feb. 19, 2014, English translation, 33 pgs.
Amendment filed Jan. 4, 2023, for U.S. Appl. No. 17/247,981, filed Jan. 4, 2021, 7 pgs.
Amendment filed Mar. 20, 2023, for U.S. Appl. No. 17/818,308, filed Aug. 8, 2021, 8 pgs.
Final Office Action dated Oct. 26, 2022, for U.S. Appl. No. 17/247,981, filed Jan. 4, 2021, 14 pgs.
Non-Final Office Action dated Jan. 19, 2023, for U.S. Appl. No. 17/818,308, filed Aug. 8, 2021, 11 pgs.
Notice of Allowance mailed Apr. 12, 2023, for U.S. Appl. No. 17/247,983, filed Jan. 4, 2021, 11 pgs.
Notice of Allowance mailed Apr. 13, 2023, for U.S. Appl. No. 17/818,308, filed Aug. 8, 2022, 8 pgs.
Notice of Allowance mailed Feb. 7, 2023, for U.S. Appl. No. 17/247,981, filed Jan. 4, 2021, 8 pgs.
Rosa, Paulo, "Minimal Computation Structures for Visual Information Applications based on Printed Electronics", New University of Lisbon, Thesis, Dec. 2015, pp. 48-49.
Notice of Allowance mailed Aug. 8, 2023, for U.S. Appl. No. 17/931,331, filed Sep. 12, 2022, 11 pgs.
Corrected Notice of Allowability dated Aug. 25, 2023, for U.S. Appl. No. 17/931,331, filed Sep. 12, 2022, 8 pgs.
Non-Final Office Action dated Oct. 27, 2023, for U.S. Appl. No. 18/304,222, filed Apr. 20, 2023, 6 pgs.
Amendment filed Oct. 27, 2023, for U.S. Appl. No. 18/304,222, filed Apr. 20, 2023, 8 pgs.
Notice of Allowance mailed Nov. 3, 2023, for U.S. Appl. No. 18/304,222, filed Apr. 20, 2023, 8 pgs.
The First Office Action dated Jan. 30, 2024, from The State Intellectual Property Office of The People's Republic of China, for Application No. 202080032604.8, 18 pgs.

* cited by examiner

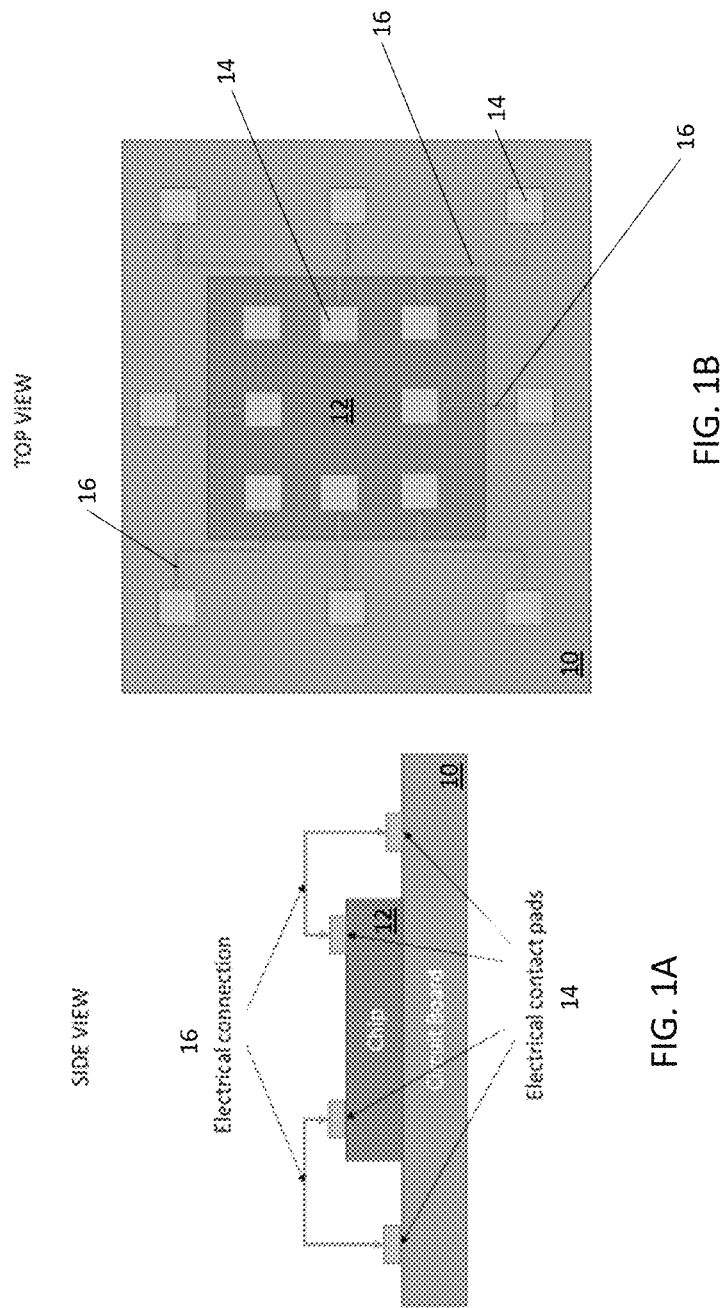

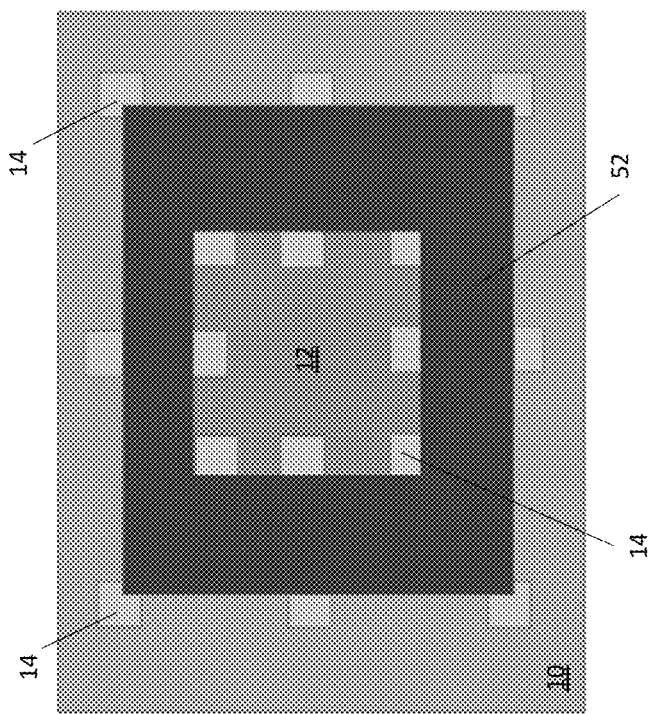
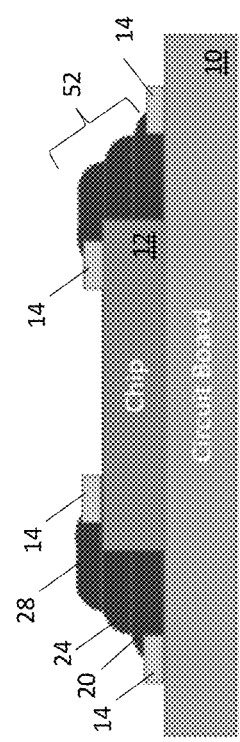
FIG. 4C
FIG. 4B
AFTER PRINTING OF THE SIDE FILLER

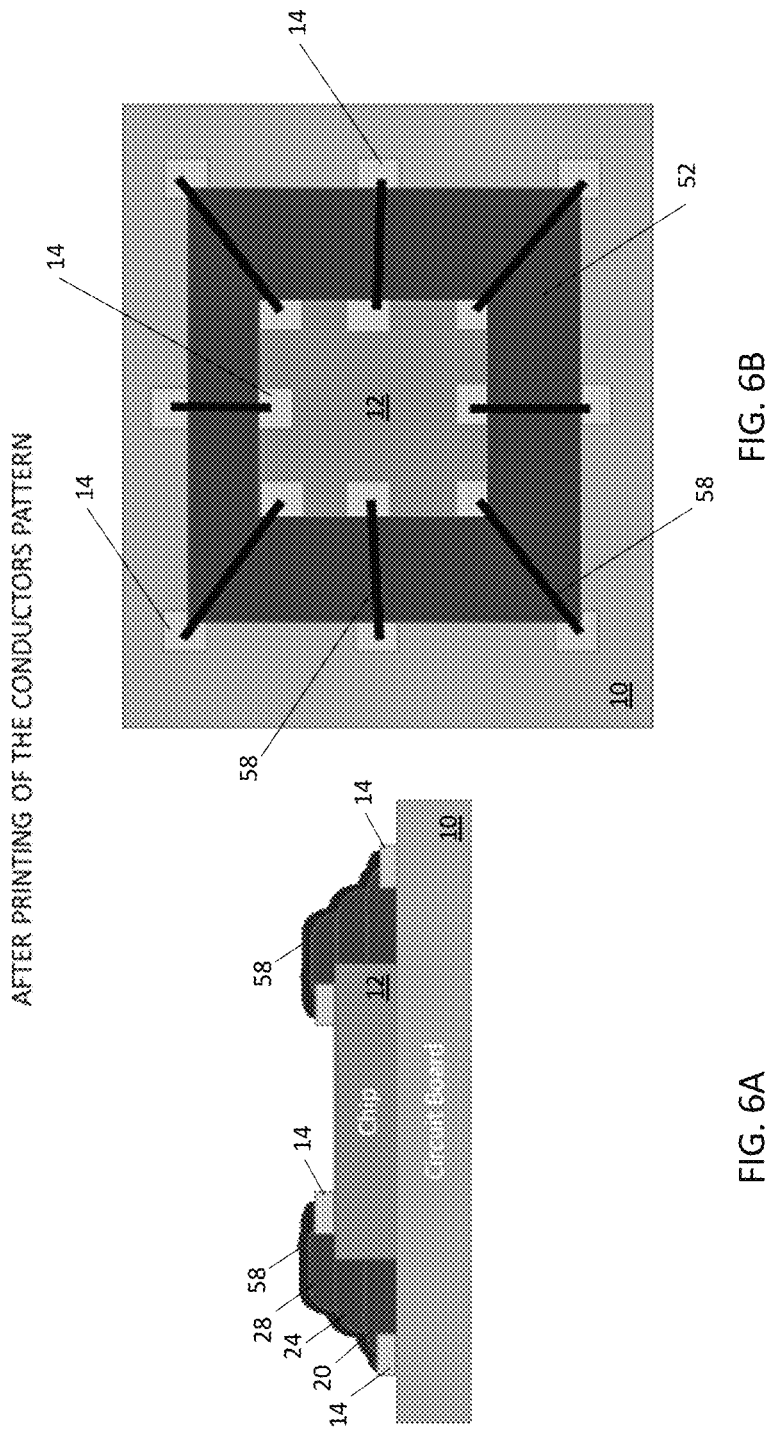

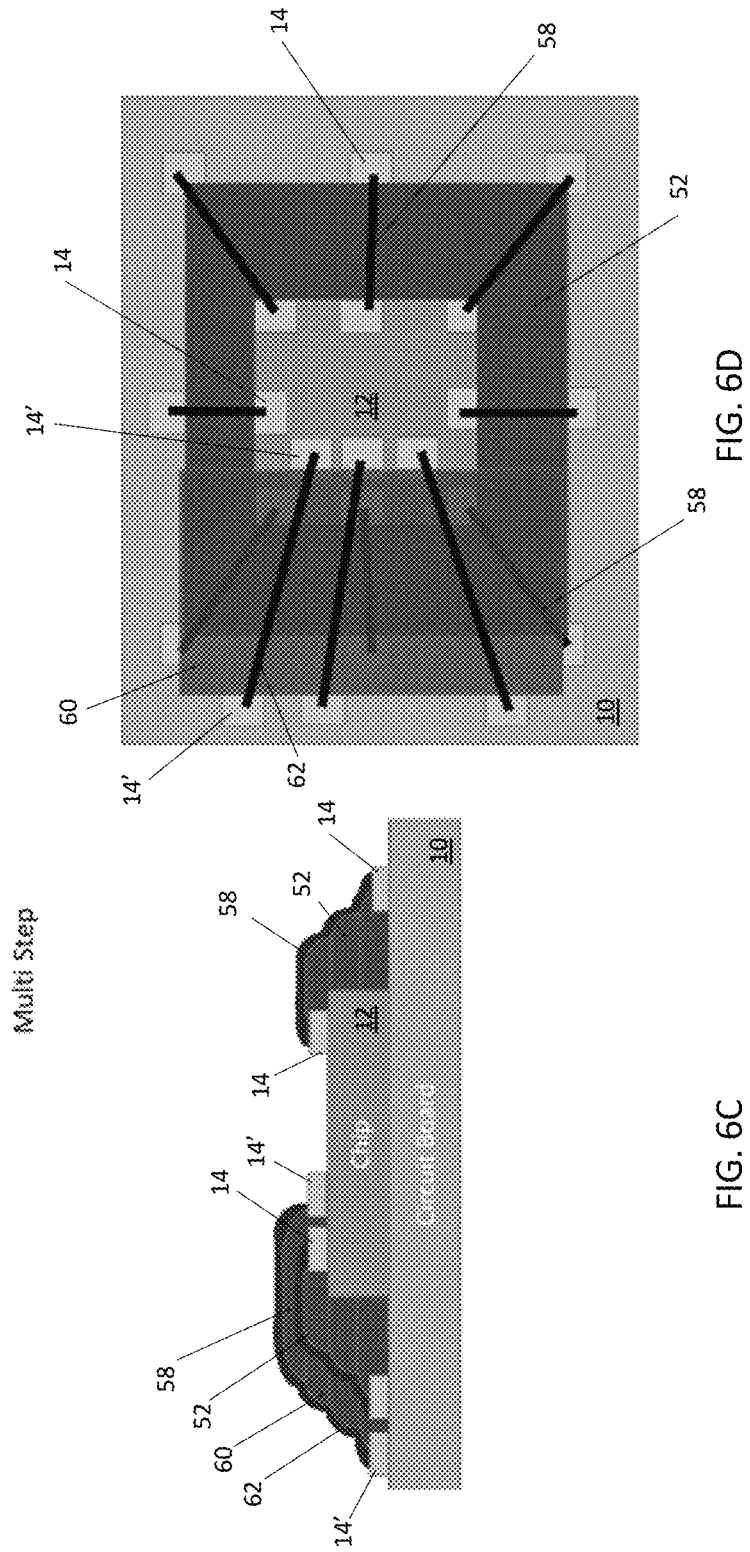

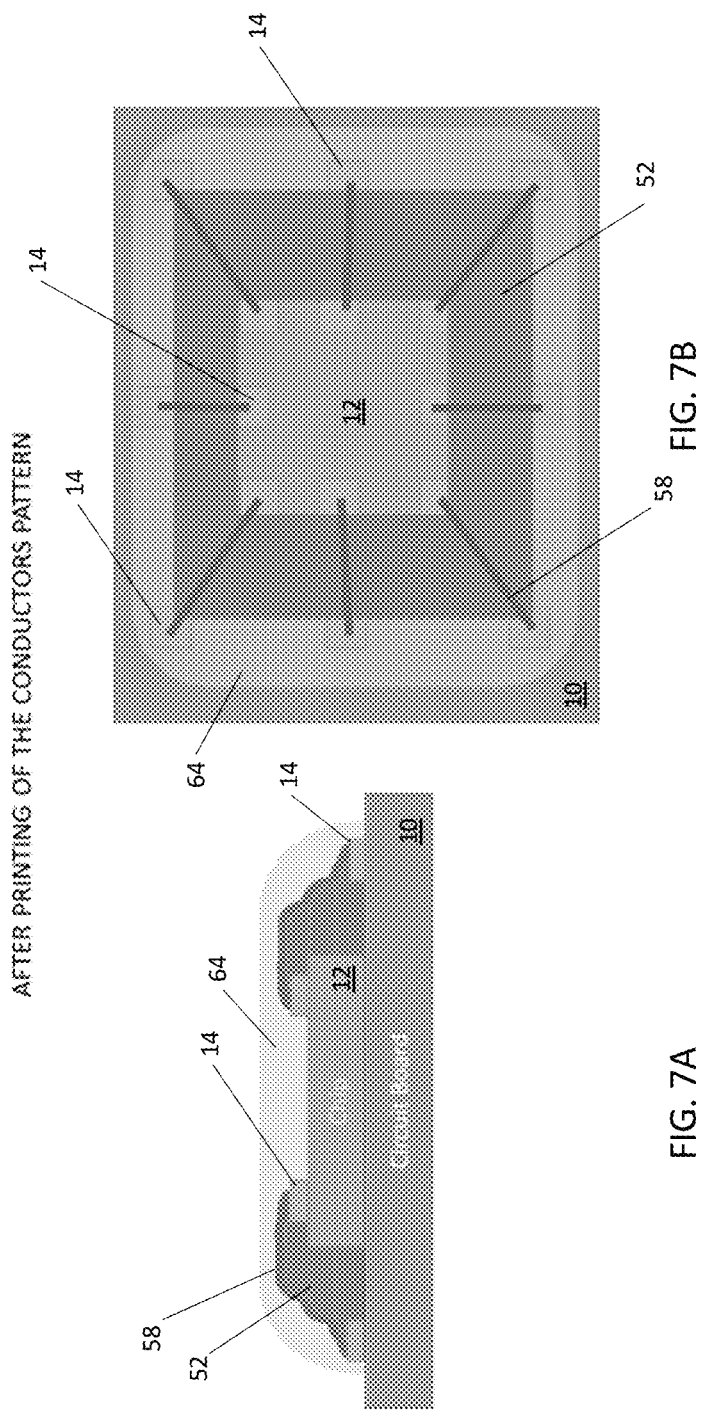

METHOD TO ELECTRICALLY CONNECT CHIP WITH TOP CONNECTORS USING 3D PRINTING

RELATED APPLICATIONS

This is a NONPROVISIONAL of, claims priority to, and incorporates by reference U.S. Provisional Application No. 62/841,349, filed 1 May 2019.

FIELD OF THE INVENTION

The present invention relates to the manufacture of three-dimensional ("3D") structures and 3D structural electronic, electromagnetic, and electromechanical components and devices, and more particularly to methods and systems for connecting top connectors of components in 3D structures by using 3D printing techniques.

BACKGROUND

There exist a number of additive manufacturing (also known as 3D printing) methods, each with different applications. Ink-jet printing technology, for example, can be used to fabricate three-dimensional objects, as described in Sachs et al., U.S. Pat. No. 5,204,055. In such instances, printer heads are used to discharge a binder material onto a layer of powder particulate in a powder bed. The powdered layer corresponds to a digitally superposed section of the object that will be produced. The binder causes the powder particles to fuse together in selected areas. This results in a fused cross-sectional segment of the object being formed on the powder bed. The steps are repeated for each successive layer until the desired object is achieved. In a final step, a laser beam scans the object, causing the powdered layers to sinter and fuse together.

In another ink-jet printing process, as described in Sanders, U.S. Pat. Nos. 5,506,607 and 5,740,051, a low-melting temperature thermoplastic material is dispensed through one ink-jet printer head to form a three-dimensional object. A second ink-jet printer head dispenses wax material to form supports for the three-dimensional object. After the object has been produced, the wax supports are removed, and the object is finished as needed.

Sun et al., WO 2014/078537 A1, describe a liquid resin system for fabricating 3D dental devices using Digital Light Processor ("DLP") projectors or other light beam irradiations, such as stereolithography ("SLA"). The DLP or SLA methods and materials can be used to make any dental device. In DLP and SLA, a polymerizable liquid resin material or heated resin material as a liquid is loaded into a resin bath of a 3D printer. In the case of DLP, 3D objects are created by projecting sequential voxel planes into the liquid (or heated) resin, which then polymerizes to solid form. Successive layers of polymerized material are added in this manner until the dental device is completely fabricated. Then the dental device is washed, finished, and fully cured as needed.

Notwithstanding the wide-spread use of technologies such as the above in various fields, the application of additive manufacturing technologies to 3D electronics is still in its infancy. Large-scale adoption has been limited due to the low reliability and poor performance of current low temperature cured, conductive ink-based technology. As a result, traditional printed circuit board (PCB) technology continues to dominate the electronics industry.

Efforts thus far to create 3D structural electronics using additive manufacturing (AM) processes (with the processes as described and defined in ASTM 2792-12a) have centered on the use of conductive inks dispensed in direct-print (DP) or other processes to provide electrical interconnects between components. U.S. Pat. Nos. 7,658,603 and 8,252,223 describe in detail the integration of fluid dispensing technology with SLA and other AM processes to create 3D circuitry. These low temperature cured inks have weaknesses in both conductivity and in durability, which limit the application of AM-fabricated 3D structural electronics to simple devices that are not subject to mechanical shock, vibration, large current or power densities, temperature extremes, or applications with high reliability requirements.

There is also a gap in the mechanical properties of AM-produced parts and injection molded-produced parts, which gap extends beyond just tensile properties to include impact, flexural, compression, creep, and fatigue properties, which collectively limit the application of AM-produced parts to prototypes.

A new approach toward 3D printing that overcome most of the material related issues mentioned above is the use of laser direct-write (LDW) techniques. In this technique, a laser beam is used to create a patterned surface with spatially-resolved three-dimensional structures by controlled material ablation or deposition. Laser-induced forward transfer (LIFT) is an LDW technique that can be applied in depositing micro-patterns on a surface. In LIFT, laser photons provide the driving force to catapult a small volume of material from a donor film toward an acceptor substrate. Typically, the laser beam interacts with an inner side of a donor film, which is coated onto a non-absorbing carrier substrate. The incident laser beam, in other words, propagates through the transparent carrier substrate before the photons are absorbed by the inner surface of the film. Above a certain energy threshold, material is ejected from the donor film toward the surface of the substrate. LIFT-based printing systems have been described in, for example, U.S. PGPUB 2005/0212888, U.S. PGPUB 2009/0074987 and WO 2016/020817 A1.

SUMMARY OF THE INVENTION

The present inventors have recognized that AM techniques, in which structures are created layer-by-layer, provide suitable fabrication processes for high value, multifunctional products for the consumer, biomedical, aerospace, and defense industries. To that end, one embodiment of the present invention provides a method for fabricating a three-dimensional (3D) electronic device. The method includes applying a liquid support material by a laser-induced forward transfer (LIFT) process to a printed circuit board (PCB) having one or more connectors and one or more electronic components thereon. The PCB is preferably situated on a stage in a work area. In some cases, the PCB (with its connectors, e.g., circuit board traces and pads, printed thereon) may be placed on the stage and the electronic components placed on the PCB after the PCB is so positioned. Once applied, the liquid support material is cured to solid (or at least semi-solid) form by cooling and/or exposure to ultraviolet (UV) radiation. Thereafter, a layer of conductive material is printed on the solid (or semi-solid) support material by LIFT to electrically connect the one or more electronic components to respective ones of the connectors on the PCB. Subsequently the layer of conductive material is dried (e.g., by heat), and metal particles in the conductive layer may be sintered using a laser beam.

In various embodiments, the liquid support material may be an epoxy acrylate, a urethane acrylate, or an acrylated monomer or oligomer. Further, the liquid support material may include a photoinitiator, e.g., in a concentration of 0.1 to 10% by weight of the liquid support material. In some cases, the photoinitiator may be a cationic photoinitiator, e.g., in a concentration of 0.05 to 3% by weight of the liquid support material.

In various embodiments, the conductive material may be a pure metal, a metal alloy, or a refractory metal. The conductive material may be present in the form of metal particles on a film or in the form of a metal paste and printed to electrically connect the electronic components to the PCB's connectors by LIFT. Optionally, prior to the sintering, the printed layer of conductive material may be cured using UV radiation.

After the sintering is complete, at least a portion of the assembly, including the one or more connectors, the conductive layer, and the one or more electronic components, may be encapsulated in an encapsulant.

These and further embodiments of the invention are described in detail below.

BRIEF DESCRIPTION OF THE DRAWINGS

The present inventors is illustrated by way of example, and not limitation, in the figures of the accompanying drawings, in which:

FIGS. 1A-1D illustrate examples of conventional electrical connections between a PCB and an electronic component situated thereon.

FIGS. 4B and 4C provide side (FIG. 4B) and top (FIG. 4C) views of the completed support structure for electrical connections between a PCB and one or more electronic components situated thereon in accordance with an embodiment of the present method for fabricating a 3D electronic device.

FIGS. 6A and 6B illustrate side (6A) and top (6B) views of the completed layer of conductive material electrically connecting connectors of the one or more electronic components to respective ones of the connectors on the PCB in accordance with an embodiment of the present method for fabricating a 3D electronic device.

FIGS. 6C and 6D illustrate side (6C) and top (6D) views of a completed multi-step process to electrically connect connectors of one or more electronic components to respective ones of the connectors on the PCB in accordance with an embodiment of the present method for fabricating a 3D electronic device.

FIGS. 7A and 7B illustrate side (7A) and top (7B) views of a completed encapsulation process in accordance with an embodiment of the present method for fabricating a 3D electronic device.

DETAILED DESCRIPTION

Figure 1C:
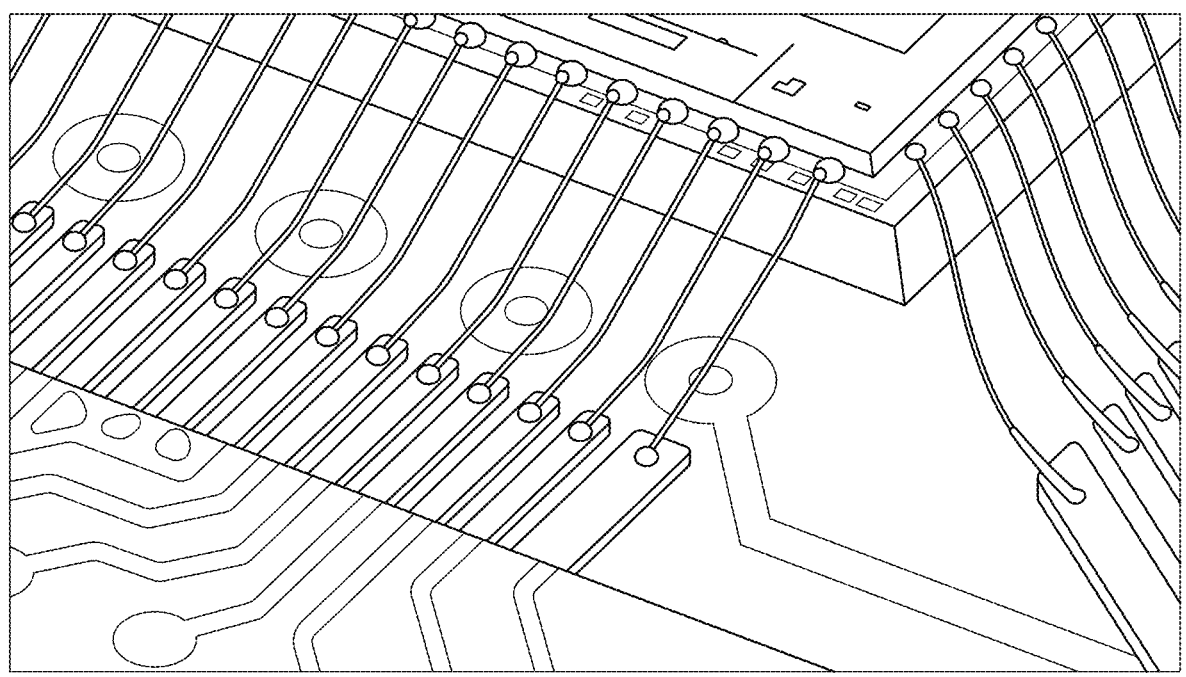

The present invention provides an approach for fabricating a three-dimensional (3D) electronic device. In various embodiments of the invention, a LIFT process is employed to print one or more layers. LIFT is described in, for example, U.S. PGPUB 2017/0189995, incorporated herein by reference. As noted above, LIFT is a form of LDW in which laser photons provide a driving force to catapult a small volume of material from a donor film toward an acceptor substrate. Using a LIFT process, a liquid support material is applied to a PCB having one or more connectors and one or more electronic components thereon. The PCB may be situated on a stage in a work area. In some cases, the PCB (with its connectors, e.g., circuit board traces and pads, printed thereon) may be placed on the stage and the electronic components placed on the PCB after the PCB is so positioned, e.g., using conventional pick and place apparatus. Once applied, the liquid support material is cured to solid (or at least semi-solid) form by cooling and/or exposure to ultraviolet (UV) radiation. Thereafter, a layer of conductive material is printed on the solid (or semi-solid) support material by LIFT to electrically connect the one or more electronic components to respective ones of the connectors on the PCB. Subsequently the layer of conductive material is dried (e.g., by heating), and metal particles in the conductive layer may be sintered using a laser beam.

The LIFT process is well-suited to the application of the support material because the receiving substrate need not be a uniform plane. As discussed below with reference to the illustrations, the support material will form a staircase-like cross-section when applied over the PCB connectors and electronic components. Curing the support material by exposure to UV radiation and/or heat creates a solid (or at least semi-solid) foundation for subsequent printing of the conductive material. The conductive material layer is printed over the supporting material and then dried, e.g., by heating using an infra-red (IR) lamp or similar arrangement. Optionally, a laser beam may be used to sinter metal particles inside the conductive layer once it is printed.

Because the printing of the supporting material is an intermediate step, it is desirable that the formation of the supporting layer not take a long period of time. Accordingly, the material from which the supporting layer is formed should take only a short time to cure (whether by UV irradiation, heating, or both) and should not shrink much (if at all) during the curing process. Materials that take an excessive time to cure will impede the overall speed of the process, and those that shrink (at least more than a little bit) during curing will impart mechanical stress on the electrically conductive layer printed over it, which may cause that layer to become discontinuous and lead to sparking across gaps or electrical open circuits.

One material that is preferred for use as a supporting layer is epoxy acrylate. Epoxy acrylates are compounds prepared by reacting epoxides, either glycidyl ethers or cyclohexene oxides, with acrylic acid, that is producing hydroxyacrylates. By way of example, the aromatic, industrially widespread BPA-DGE or epoxyphenol novolaks are reacted to the corresponding hydroxyacrylates. These are available commercially (e.g., from Rahn, BASF, Sartomer, etc.). Common to these products are viscosities of about 500-50000 Pas in an undiluted state. For reasons of handling and processing they are generally diluted with a low-viscosity (5-50 mPas, 25° C.) acrylic monomer, such as HDDA, TMPTA, TPGDA, and other monomers known in the art. Radiation-induced free-radical curing of such products produces films having good mechanical properties from the standpoint of the present invention.

The radiation-curable compositions normally include a photoinitiator. The photoinitiator content is preferably from 0.1 to 10% by weight, based in each case on the total amount of the epoxy acrylates. Suitable photoinitiators are known in the art and are also available commercially. Use may be made, for example, of products available commercially under the name SpeedCure™ by Lambson™. In the case of optional hybrid system compositions comprising an oxirane compound, use is additionally made of initiators for photo-cationic polymerization, which are likewise known in the art. Photoinitiators for cationic polymerization generate strong Bronsted acids when exposed to UV radiation and thereby initiate the polymerization of the epoxide groups. The compositions contain cationic photoinitiators (also available by the same brand name from Lambson) generally in amounts from 0.05 to 3% by weight, based on the epoxy resin component. Besides photoinitiators, suitable sensitizers can be used in effective amounts. The compositions are advantageously cured with UV radiation.

Although the preferred materials for use as a support layer are epoxy acrylates, since they tend to react very fast, recent progress with other acrylates, such as urethane acrylate, has produced compounds that react (cure) rapidly with very low shrinkage. For example, Gemoner 4215 from Rahn™, as well as other acrylated monomers and oligomers, offer both rapid cure times and low shrinkage factors.

The active or conductive material used for electrical connections between the connectors of an electrical component and those of a PCB generally comprise one or more metals. As described below, a metal layer is applied over the support material between the connectors on the PCB and those on the electrical components. Metals that are contemplated include pure metals, metal alloys, and refractory metals. The active material may be applied (printed) using LIFT either from a solid state, e.g., small metal particles that are deposited on a plastic film can be used in the LIFT process to generate a conductive layer, or in the form of a paste carried on a donor film. Metal pastes that are appropriate for use in the LIFT process are well known in the industry and are described for example in: WO 2014/113937 A1, U.S. Pat. Nos. 6,537,359 B1 and 7,198,736 B2, and U.S. PGPUB 2013/0224474, incorporated herein by reference.

Figure 1D:
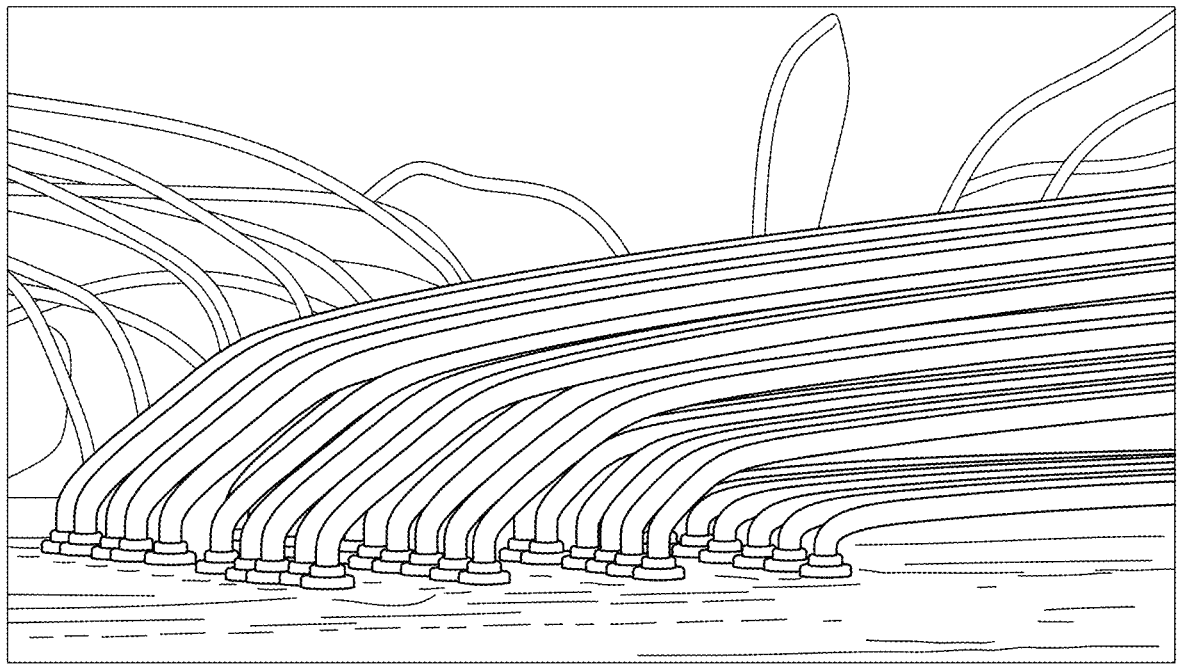

Referring now to FIGS. 1A-1D, conventional electrical connections between a PCB 10 and an electronic component (e.g., an integrated circuit or "chip") 12 situated thereon are illustrated. The electrical connections 16 are made between respective electrical connectors (e.g., contact pads) 14 of the PCB 10 and the electronic component 12, and are typically in the form of thin wires. FIG. 1A presents a side view of this arrangement, which FIG. 1B shows a top view thereof. FIGS. 1C and 1D are photographic images showing real world examples of such connections.

Figure 4A:
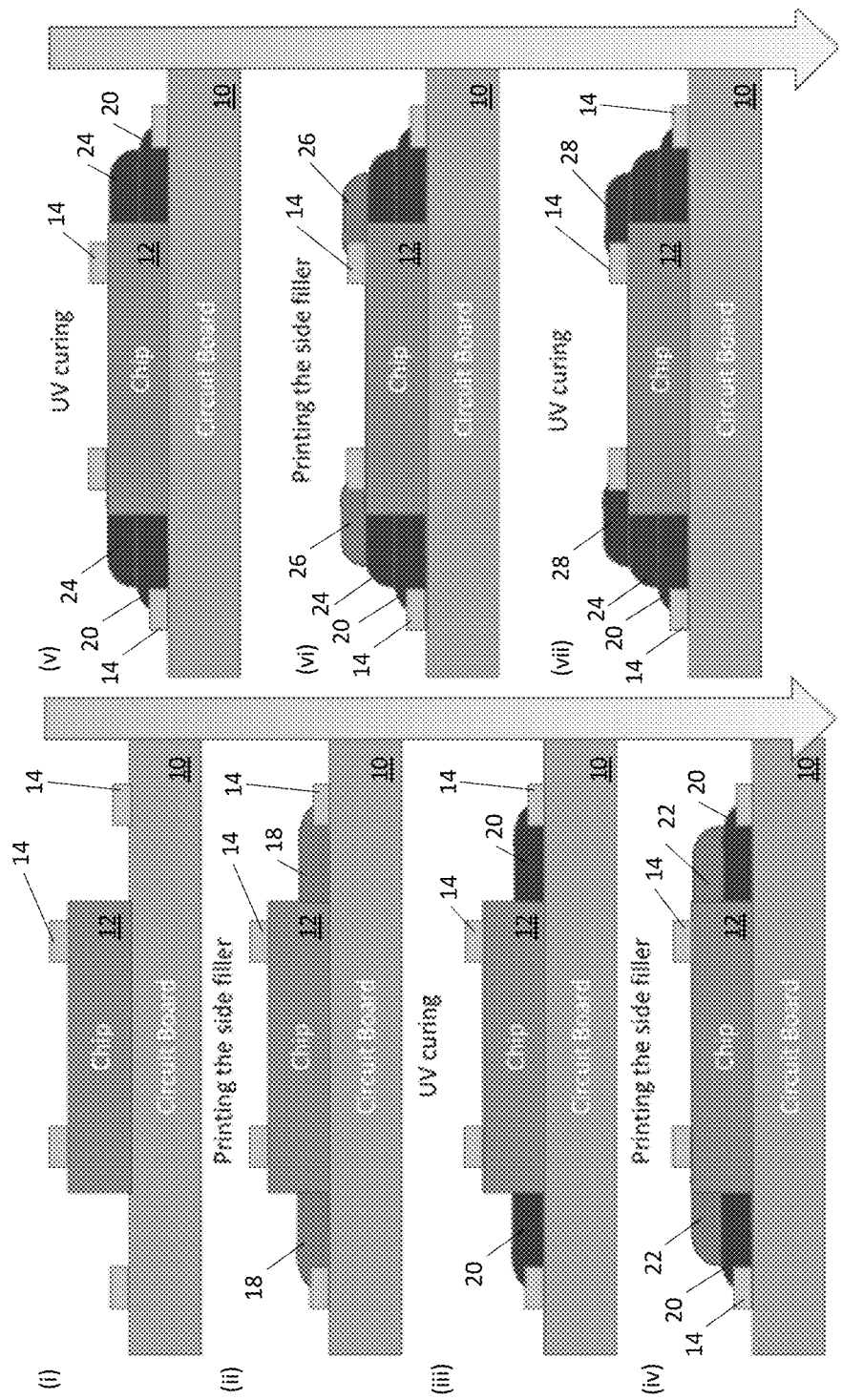
FIG. 4A illustrates an example of forming support layers for electrical connections between a PCB and one or more electronic components situated thereon in accordance with an embodiment of the present method for fabricating a 3D electronic device.

Referring now to FIG. 4A, an embodiment of the present method for fabricating a 3D electronic device will be described. PCB 10 with one or more electronic components 12 situated thereon (view (i)) may be placed on a stage (not shown, but see FIG. 2 for an example) in a work area. In some cases, PCB 10 may be placed on the stage and the electronic components 12 placed on PCB 10 after the PCB is so positioned. PCB 10 and electronic components 12 each have their own respective connectors 14, e.g., circuit board traces and pads, etc., printed or affixed thereon. Usually these connectors are situated near the peripheries of the respective PCB 10 and electronic components 12, but they need not necessarily be so positioned. Also, although the connectors are shown as protruding from the surfaces of the PCB 10 and electronic components 12, in practice they may be printed nearly flush with those surfaces (see, e.g., FIG. 1C). Further, the electronic components 12 may be positioned in a carrier, socket, or other mounting package and the connectors 14 located on that package rather than on the electronic component itself. Hence, the term electronic component as used herein is intended to encompass the components themselves as well as any mounting package.

Using a LIFT process (view (ii)), a liquid support material 18 is applied to PCB 10 in areas where subsequent electronic connections between the PCB's connectors and the electronic component's connectors will be formed. As shown, this will often be within gaps between edges of the electronic components 12 and the connectors 14 of the PCB 10. The support material 18 should be applied in an amount sufficient to fully support the subsequent electronic connections. As shown in views (ii)-(vii), this may mean applying several layers 18, 22, 26 (views (ii), (iv), and (vi)), of liquid support material, one atop the other, with curing steps (views (iii), (v), and (vii)) after each application of a layer. The curing, which may be done using UV illumination and, optionally, heat (e.g., from an IR lamp, heater, or similar apparatus), forms solidified (or at least partly-solidified) supporting layers 20, 24, 28. The completed, solid supporting structure made up of layers of support material 20, 24, 28 will provide a completely supported path for the electrical connections between the connectors of the electronic components and those of the PCB.

Figure 2:
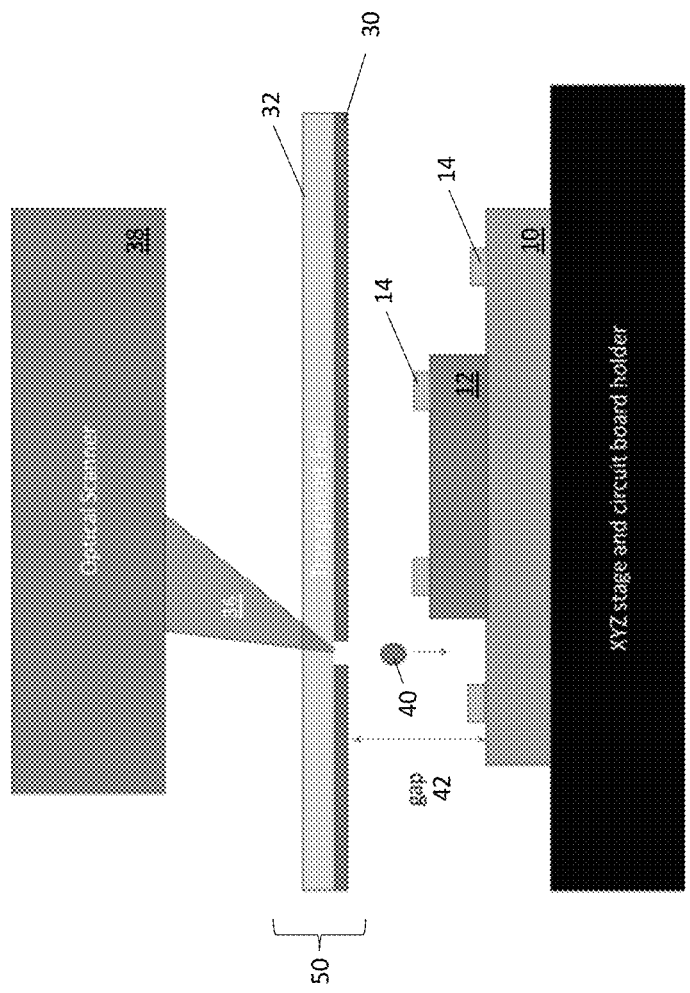
FIG. 2 illustrates an example of the deposition of material droplets by a LIFT process.

FIG. 2 shows an example of a LIFT process that can be used to apply the liquid support material. The same process can be used to print the electrical connections between the connectors of the electronic components and those of the PCB, so reference will be made to a general printed material 30. It should be understood that the printed material 30 may be the support material or a metal or other substance used to form the electrical connections, as applicable.

The LIFT process creates and ejects droplets 40 of the printed material 30, which is carried (e.g., in the form of a thin foil or film) on a back side (from the standpoint of an incident laser beam 36) of a transparent substrate 32. Together, the foil/film of printed material 30 and transparent substrate 32 form a donor substrate 50. To form the droplets, laser beam 36 is scanned over the donor substrate 50 by an optical scanner arrangement 38, e.g., in a raster scan or other pattern, and focused on a small area of the foil/film of printed material 30 through the transparent substrate 32 on which it is carried. The laser is preferably operated in a pulsed fashion and scanning in this context typically includes deflection of the laser beam 36 (e.g., using mirrors, prisms, and/or other optical elements of optical scanner assembly 38) in order to cover small areas on an acceptor substrate (e.g., PCB 10) and may also include translation of the donor and/or acceptor substrate, e.g., via stage 34 which is capable of moving the PCB in two or three dimensions, relative to the optical assembly 38, or vice versa, in order to cover larger loci.

During the scanning, pulsing of the laser beam 36 on the foil/film of printed material 30 results in local heating, which causes a droplet 40 of the printed material 30 to be jetted. The size of the droplet 40 is generally proportional to the cross-section of the laser beam 36 incident on the foil/film of printed material 30. The droplet 40 so ejected travels across a gap 42 (typically on the order of a few microns to a few millimeters) and coalesces on a recipient substrate such as PCB 10. Aggregation of the droplets of printed material 30 fills a predefined location on the acceptor substrate (PCB 10) to a desired height.

Figure 3:
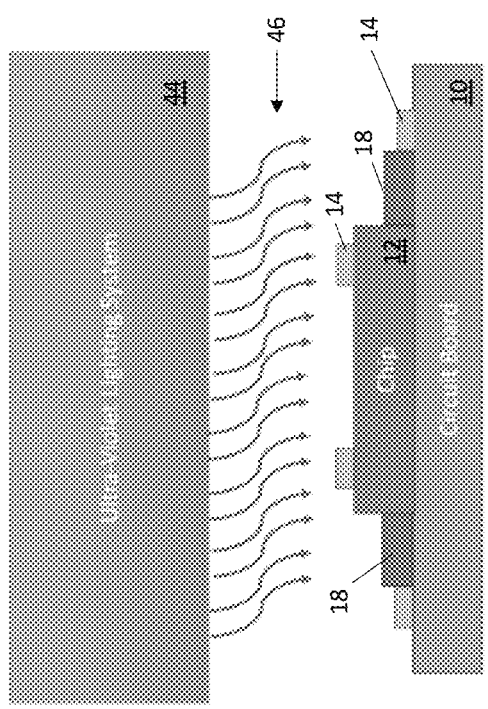
FIG. 3 illustrates an example of a curing process for a layer of applied supporting material on which electrical connections between a PCB and one or more electronic components situated thereon will be printed in accordance with an embodiment of the present method for fabricating a 3D electronic device.

FIG. 3 illustrates an example of the curing process for a layer 18, 22, 26 of the support materials. In the same work area, or a different one, used for the LIFT process, the layer of support material is exposed to UV radiation 46 from a UV lighting system source 44. The UV lighting system may include a plurality of UV emitters, e.g., UV light emitting diodes (LEDs), which emit radiation at one or more wavelengths at which the photoinitiators included in the support material 18, 22, 26 are sensitive. When exposed to the UV radiation, these photoinitiators create species that react with monomers and/or oligomers of the support material to initiate polymer chain growth therein, leading to solidification.

Returning to the discussion of forming the support layers, once the solid supporting structure made up of layers of support material, 20, 24, 28 is present to the desired height and locations (FIG. 4A view (vii)), the resulting support structure 52 will resemble that shown in FIGS. 4B and 4C. As shown in these views, the support structure 52 forms a completely supported path resembling a staircase in side profile (see FIG. 4B) on which the electrical connections between the connectors of the electronic components and those of the PCB can be printed.

Figure 5:
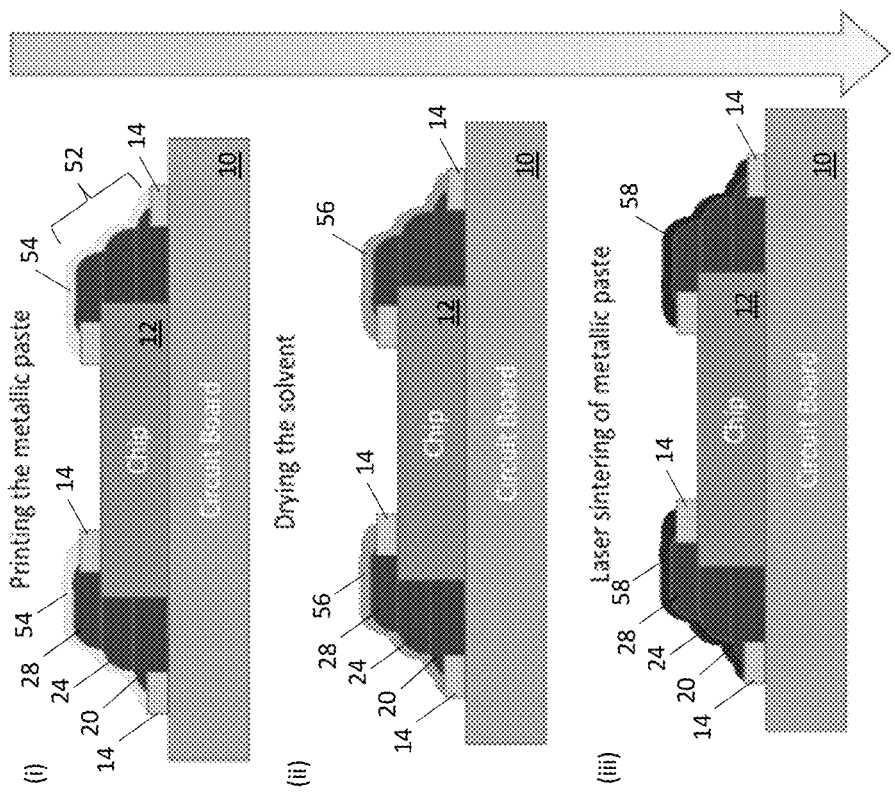
FIG. 5 illustrates the printing, drying, and sintering of conductive material over a solid (or at least semi-solid) support material structure to electrically connect connectors of the one or more electronic components to respective ones of the connectors on the PCB in accordance with an embodiment of the present method for fabricating a 3D electronic device.

Referring now to FIG. 5, once the liquid support material is cured to solid (or at least semi-solid) form, a layer of conductive material 54 is printed (view (i)) on the solid (or semi-solid) support material by LIFT to electrically connect connectors of the one or more electronic components 12 to respective ones of the connectors on the PCB 10. As indicated above, the same LIFT process used for the support material layers may be used to print the layer of conductive material 54. Subsequently, the layer of conductive material is dried (view (ii) (e.g., by heating) to form a dried layer of conductive material 56, and metal particles in the conductive layer may be sintered (view (iii)) using a laser beam to form a final conductive layer 58. This results in a very highly conductive connection. FIGS. 6A and 6B illustrate the completed layer of conductive material 58. As shown in FIG. 6B, the layer of conductive material need not be printed over the entirety of the support structure 52, and instead need only be present as conductive wires between respective connectors 14 of the PCB 10 and electrical components 12.

As shown in FIGS. 6C and 6D, the same procedures can be used multiple times to create very complex structures with multiple wires. For example, the above-described process for creating a support structure followed by printing a layer of conductive material thereover can be applied in a multi-step procedure to electrically connect additional respective connectors 14' of the electrical component(s) 12 and the PCB 10. In the illustrated example, a second set of connectors 14' of the electrical component(s) 12 and the PCB 10 are electrically connected by a second set of electrical conductors 62 that are printed over a second support structure 60 applied over top of the conductive layer 58. The second support structure 60 may be applied in the same fashion as support structure 52 discussed above (e.g., using LIFT) to create one or more layers of support material, and the conductive elements 62 may be printed in the same fashion as conductive elements 58 on the second support structure 60. The second support structure and second conductive elements may be fashioned as needed, for an entire electrical component 12 or only a portion thereof. Of course, additional support structures and conductive elements may be fashioned in the manner described above, as needed, to complete electrical connections between the electrical component(s) 12 and PCB 10 as required.

To protect the final electronic structure, a top coat or encapsulation layer may be applied over the structure, as shown in FIGS. 7A (side view) and 7B (top view). Again, a LIFT process as described above can be used to print also the top coat of encapsulant 64, but so too may other known industrial materials and processes be used. Examples of materials for top coat 64 are described in U.S. Pat. No. 5,436,083 A, incorporated herein by reference, and alternative industrial processes for coating are described at WO 2015/192146 A1, JP H01 221466 A, U.S. PGPUB 2013/0176700 A1, incorporated herein by reference.

Thus, a method for fabricating a 3D electronic device has been described.

What is claimed is:

1. A method for fabricating a three-dimensional (3D) electronic device, the method comprising:

iteratively applying layers of a liquid support material by a laser-induced forward transfer (LIFT) process to a printed circuit board (PCB) having a first contact pad and an electronic component thereon, the PCB being disposed on a stage in a work area, and the electronic component having a mounting package and a second contact pad protruding from a top surface of the mounting package, wherein each respective layer of the liquid support material is applied in a gap between the first contact pad and the second contact pad and, after application, the respective layer of the liquid support material is cured to form a solid support structure by cooling and/or exposure to ultraviolet (UV) radiation, such that after application and curing of a number of successive layers of the liquid support material, a solid support structure is formed between the first contact pad and the second contact pad, a cross section of the solid support structure having a staircase side profile with multiple steps, with a height of each of the steps being less than a thickness of the electronic component, and a top most one of the steps contacting (i) a portion of the top surface of the mounting package and (ii) a side surface of the second contact pad protruding from the top surface of the mounting package;

printing a layer of conductive material on the staircase side profile of the solid support structure by the LIFT process;

drying the layer of conductive material by heat so as to form a dried layer of conductive material;

sintering metal particles in the dried layer of conductive material using a laser beam to form a conductive layer that electrically connects the second contact pad of the electronic component to the first contact pad of the PCB; and encapsulating the first and second contact pads, the conductive layer, and the electronic component in an encapsulant by the LIFT process.

2. The method of claim 1, wherein the liquid support material is an epoxy acrylate, a urethane acrylate, or an acrylated monomer or oligomer.

3. The method of claim 2, wherein the liquid support material includes a photoinitiator.

4. The method of claim 3, wherein the photoinitiator is in a concentration of 0.1 to 10% by weight of the liquid support material.

5. The method of claim 3, wherein the photoinitiator is a cationic photoinitiator.

6. The method of claim 5, wherein the cationic photoinitiator is in a concentration of 0.05 to 3% by weight of the liquid support material.

7. The method of claim 3, wherein the conductive material is a pure metal, a metal alloy, or a refractory metal.

8. The method of claim 7, wherein printing the layer of conductive material on the solid support structure by the LIFT process comprises printing metal particles from a film onto the solid support structure.

9. The method of claim 7, wherein printing the layer of conductive material on the solid support structure by the LIFT process comprises printing metal paste from a film onto the solid support structure.

10. The method of claim 1, wherein prior to the sintering, curing the printed layer of conductive material using UV radiation.

11. The method of claim 1, wherein each respective layer of the liquid support material forms a single step of the solid support structure.

* * * * *